United States Patent
Brewer et al.

(10) Patent No.: US 12,394,746 B2
(45) Date of Patent: Aug. 19, 2025

(54) COMPRESSION SYSTEM CALIBRATION

(71) Applicant: The Boeing Company, Chicago, IL (US)

(72) Inventors: Peter D. Brewer, Westlake Village, CA (US); Chia-Ming Chang, Agoura Hills, CA (US); Partia Naghibi Mahmoudabadi, Canoga Park, CA (US); Sevag Terterian, Lake Balboa, CA (US); Diego Eduardo Carrasco, Los Angeles, CA (US); Charbel Abijaoude, Newbury Park, CA (US)

(73) Assignee: The Boeing Company, Chicago, IL (US)

( * ) Notice: Subject to any disclaimer, the term of this patent is extended or adjusted under 35 U.S.C. 154(b) by 648 days.

(21) Appl. No.: 17/663,853

(22) Filed: May 18, 2022

(65) Prior Publication Data
US 2023/0378120 A1 Nov. 23, 2023

(51) Int. Cl.
*H01L 23/00* (2006.01)
*G06T 7/60* (2017.01)

(52) U.S. Cl.
CPC ............ *H01L 24/75* (2013.01); *G06T 7/60* (2013.01); *H01L 24/81* (2013.01); *H01L 2224/75001* (2013.01); *H01L 2224/81201* (2013.01)

(58) Field of Classification Search
CPC . H01L 2224/75001; H01L 24/75; G01N 3/42; B23K 1/0016
See application file for complete search history.

(56) References Cited

U.S. PATENT DOCUMENTS

| | | | | |
|---|---|---|---|---|
| 6,300,782 | B1 * | 10/2001 | Hembree | H01R 13/24 29/874 |
| 2011/0178728 | A1 * | 7/2011 | Sawa | G01N 3/42 702/41 |
| 2014/0090480 | A1 * | 4/2014 | Adams | G01N 3/00 73/818 |
| 2014/0217153 | A1 * | 8/2014 | Yoshimoto | H01L 21/67144 228/104 |
| 2015/0155254 | A1 * | 6/2015 | Schmidt-Lange | H01L 24/81 228/104 |
| 2015/0171049 | A1 * | 6/2015 | Wasserman | H01L 24/81 228/104 |

(Continued)

OTHER PUBLICATIONS

Broitman, "Indentation Hardness Measurements at Macro-, Micro-, and Nanoscale: A Critical Overview", Dec. 28, 2016, p. 1-18.

(Continued)

*Primary Examiner* — Michael W Hotchkiss
(74) *Attorney, Agent, or Firm* — Yee & Associates, P.C.

(57) ABSTRACT

A method to aid in a calibration of a compression system includes mounting a first substrate in a press. The press has calibration parameters, and the first substrate has a test film on a first surface. The method includes mounting a second substrate in the press. The second substrate has spikes arranged in a spike pattern on a second surface. The method includes compressing the first substrate and the second substrate together with a force that causes the spikes to form indentations in the test film, separating the first substrate from the second substrate, determining local pressures applied by the spikes against the test film, and adjusting one or more calibration parameters of the press in response to the local pressures.

20 Claims, 8 Drawing Sheets

(56) References Cited

U.S. PATENT DOCUMENTS

| | | | |
|---|---|---|---|
| 2017/0108534 A1* | 4/2017 | Appinger | G01R 31/2887 |
| 2018/0217040 A1* | 8/2018 | Tsujii | G01N 3/62 |
| 2020/0141976 A1* | 5/2020 | Lim | G01R 1/06794 |
| 2021/0123948 A1* | 4/2021 | Brown | G01Q 30/04 |

OTHER PUBLICATIONS

Prittchard, E. et al., "Flexible Capacitive Sensors for High Resolution Pressure Measurement", IEEE Sensors 2008 Conference, 2008, p. 1484-1487, Retrieved from https://doi.org/10.1109/ICSENS.2008.4716726.

Akiyama, M. et al., "Flexible Piezoelectric Pressure Sensors Using Oriented Aluminum Nitride Thin Films Prepared on Polyethylene Terephthalate Films", Journal of Applied Physics, 2000, vol. 100, Issue 114318, American Institute of Physics, Retrieved from https://doi.org/10.1063/1.2401312.

Song, P. et al., "Recent Progress of Miniature MEMS Pressure Sensors", Michromachines Journal, 2020, vol. 11, Issue 56, Retrieved from https://doi.org/10.3390/mi11010056.

Ashruf, C.M.A., "Thin Flexible Pressure Sensors", Sensor Review, 2002, p. 322-327, vol. 22, Issue 4, MCB UP Limited, Retrieved from: https://doi.org/10.1108/02602280210444636.

\* cited by examiner

COMPRESSION SYSTEM CALIBRATION

TECHNICAL FIELD

The disclosure relates generally to flip-chip bonding, and in particular, to a compression system calibration.

BACKGROUND

Current computing systems involve dense integrations of a range of different elements, including processors, application specific integrated circuit accelerators, memory devices, high speed input/output devices, network processing devices, and power delivery/power management devices. Three-dimensional integration of the devices provides a performance advancement due to an increase in interconnectivity between constituent elements. The three-dimensional integration involves inter-chip bonding. The inter-chip bonding is dependent on even pressure distributions across arrays of bumps and bonding pads on the chips. Issues arise where the bonding pressure that each bump experiences is non-uniform. Bumps at the edges and corners tend to be over compressed during the bonding. If the pitch between bumps is large, for example 50 microns or greater, the compression forces have a varying function with an oscillatory behavior.

Accordingly, those skilled in the art continue with research and development efforts in the field of flip-chip bonding to provide uniform compression forces.

SUMMARY

A method to aid in a calibration of a compression system is provided herein. The method includes mounting a first substrate with a first surface facing outward in a press The press has a plurality of calibration parameters, and the first substrate has a test film on the first surface. The method includes mounting a second substrate in the press with a second surface of the second substrate facing the first surface of the first substrate. The second substrate has a plurality of spikes arranged in a spike pattern on the second surface. The method further includes compressing the first substrate and the second substrate together with a force that causes the plurality of spikes to form a plurality of indentations in the test film, separating the first substrate from the second substrate, determining a plurality of local pressures applied by the plurality of spikes against the test film during the compressing, and adjusting one or more of the plurality of calibration parameters of the press in response to the plurality of local pressures.

In one or more embodiments of the method, the determining of the plurality of local pressures includes generating an image of the plurality of indentations in the test film, wherein a plurality of light intensities in the image are representative of the plurality of local pressures applied by the plurality of spikes against the test film during the compressing.

In one or more embodiments, the method further includes determining a plurality of dimensions of the plurality of indentations in response to the plurality of light intensities in the image, and calculating a plurality of absolute values of the plurality of local pressures applied to the test film in response to the plurality of dimensions of the plurality of indentations and the force applied between the first substrate and the second substrate.

In one or more embodiments, the method further includes forming an over-coat layer on each of the plurality of spikes that prevents a formation of a metallurgical bond between the plurality of spikes and the test film during the compressing.

In one or more embodiments of the method, the adjusting of the one or more of the plurality of calibration parameters of the press is adjusting a tilt that the press establishes between the first substrate and the second substrate.

In one or more embodiments of the method, the adjusting of the one or more of the plurality of calibration parameters of the press is adjusting the force that the press applies during the compressing.

In one or more embodiments, the method further includes generating a pressure map in two-dimensions based on the plurality of local pressures, wherein the adjusting of the one or more of the plurality of calibration parameters of the press is in further response to the pressure map.

In one or more embodiments, the method further includes replacing the first substrate with an additional first substrate after the adjusting of the one or more of the plurality of calibration parameters of the press, and compressing the additional first substrate and the second substrate together with the force.

In one or more embodiments, the method further includes replacing the first substrate with a first working part after the adjusting of the one or more of the plurality of calibration parameters, replacing the second substrate with a second working part, and bonding the first working part to the second working part with the press.

A compression system is provided herein. The compression system includes a first substrate, a second substrate, a press, and a sensor. The first substrate has a test film on a first surface. The second substrate has a plurality of spikes arranged in a spike pattern on a second surface. The press has a plurality of calibration parameters. The press is configured to mount the first substrate with the first surface facing outward, mount the second substrate with the second surface of the second substrate facing the first surface of the first substrate, compress the first substrate and the second substrate together with a force that causes the plurality of spikes to form a plurality of indentations in the test film, and separate the first substrate from the second substrate. The sensor is configured to determine a plurality of local pressures applied by the plurality of spikes against the test film during the compression. One or more of the plurality of calibration parameters of the press is adjustable in response to the plurality of local pressures.

In one or more embodiments of the compression system, the sensor is a camera configured to generate an image of the plurality of indentations in the test film. A plurality of light intensities in the image are representative of the plurality of local pressures applied by the plurality of spikes against the test film during the compression.

In one or more embodiments, the compression system further includes a computer configured to determine a plurality of dimensions of the plurality of indentations in response to the plurality of light intensities in the image, and calculate a plurality of absolute values of the plurality of local pressures applied to the test film in response to the plurality of dimensions of the plurality of indentations and the force applied between the first substrate and the second substrate.

In one or more embodiments of the compression system, each of the plurality of indentations has a shape that retroreflects light, and the camera presents the image as off-axis light reflecting from the plurality of indentations.

In one or more embodiments of the compression system, each of the plurality of spikes is formed with an over-coat layer that prevents a formation of a metallurgical bond between the plurality of spikes and the test film during the compression.

In one or more embodiments of the compression system, the plurality of spikes have a cone shape, and the spike pattern comprises at least 1,000 of the plurality of spikes.

A calibration kit is provided herein. The calibration kit includes a first substrate and a second substrate. The first substrate has a test film on a first surface. The test film has a first hardness. The second substrate has a plurality of spikes arranged in a spike pattern on a second surface. A second hardness of the plurality of spikes is greater than the first hardness of the test film such that the plurality of spikes create a plurality of indentations in the test film in response to the first substrate and the second substrate being compressed together.

In one or more embodiments of the calibration kit, the plurality of spikes includes an over-coat layer that prevents a formation of a metallurgical bond between the plurality of spikes and the test film while being compressed together.

In one or more embodiments of the calibration kit, each of the first substrate and the second substrate comprises a semiconductor.

In one or more embodiments of the calibration kit, the first substrate is one of a semiconductor die, a semiconductor tile, or a semiconductor wafer, and the second substrate is one of the semiconductor die, the semiconductor tile, or the semiconductor wafer.

In one or more embodiments of the calibration kit, the test film is formed from gold, aluminum, indium, copper, platinum, palladium, or a first alloy thereof, and the plurality of spikes is formed from beryllium, titanium, palladium, vanadium, copper, manganese, nickel, cobalt, iron, rhodium, chromium, molybdenum, ruthenium, platinum, tantalum, tungsten, rhenium, iridium, aluminum oxide, silicon carbide, or a second alloy thereof.

The above features and advantages, and other features and advantages of the present disclosure are readily apparent from the following detailed description of the best modes for carrying out the disclosure when taken in connection with the accompanying drawings.

DETAILED DESCRIPTION

Embodiments of the present disclosure generally include a system, method and/or kit that addresses calibration of a press used in inter-substrate bonding. The designs disclosed herein enable high resolution measurements and/or visualizations of local (e.g., nanometer scale to micrometer scale) bonding pressures and global (e.g., millimeter scale to decimeter scale) pressure distributions in fine-pitch area arrays. The bonding pressures occur during substrate-to-substrate bonding for fine-pitch integration applications. Pitch in reference to distance generally means a period of the array pattern. The period indicates how close two spikes may be placed next to each other.

Maps of local pressure distributions and global pressure distributions are created by employing arrays of nanometer-sharp spike structures to imprint (e.g., plastically deform) a surface of a patterned or an un-patterned metallized substrate (e.g., wafer, tile, die). The metal on the substrate has known, or measurable, material properties (e.g., hardness, thickness, and Young's modulus). An applied pressure distribution is determined from an indentation dimension distribution. Since an overall force applied to the substrate is known or measured by a sensor of the compression system, accurate quantitative local pressures and global pressure distributions may be derived. The arrays of spike indenters are configured in either arbitrary patterns or uniform arrayed patterns to mimic a particular bond pad layout. The arrays allow direct measurement of stress and displacement distributions suitable to predict bond yields of a given applied force for a particular array configuration. In various embodiments, the dimensions of the indented imprints are detected using dark field microscopy where reflected light intensities are directly related to the dimensions of the imprints. Measuring the reflected light intensities allows efficient assessment and direct conversion of the light intensity distributions into pressure maps.

Figure 1:
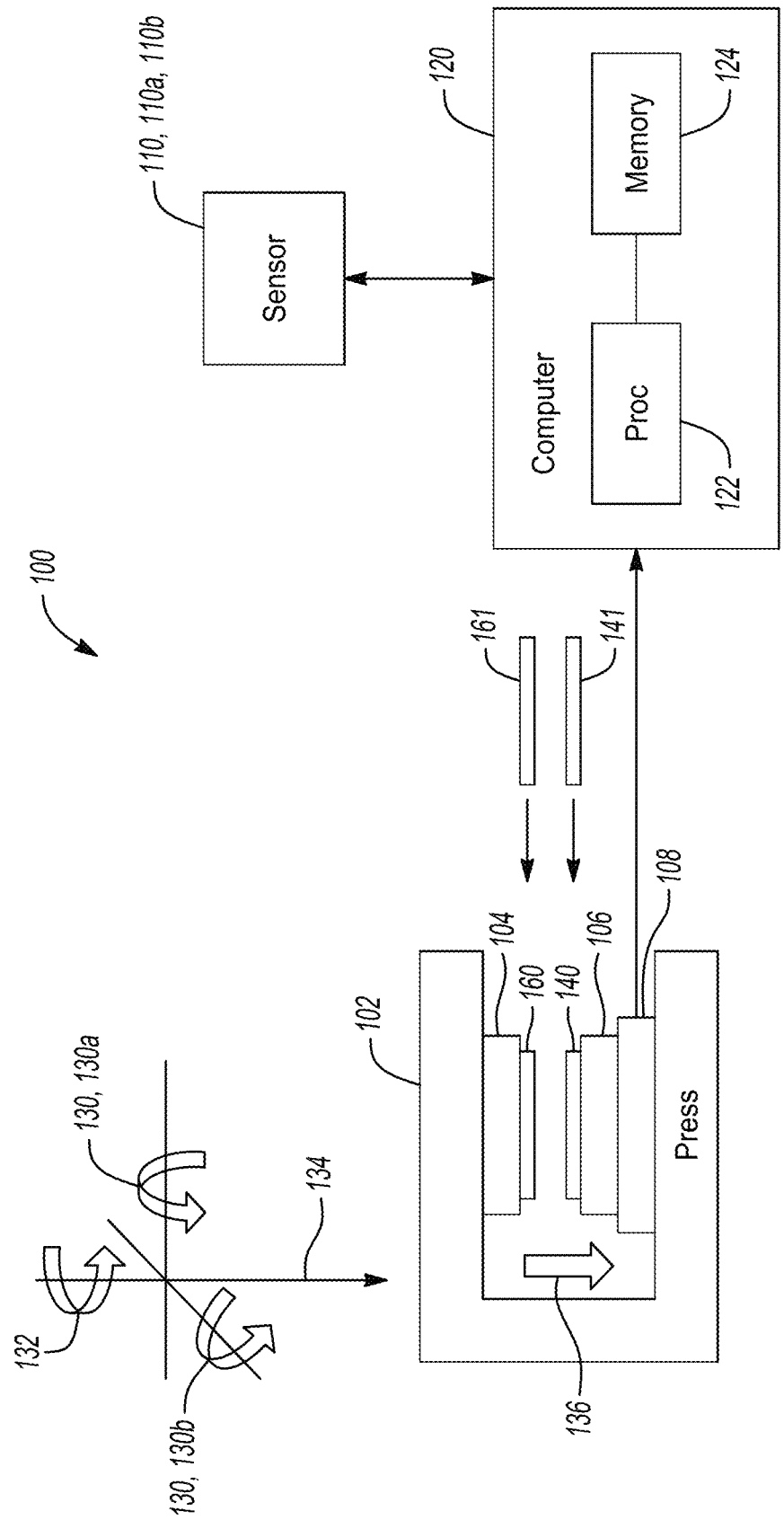
FIG. 1 is a schematic diagram of a compression system in accordance with one or more exemplary embodiments.

Referring to FIG. 1, a schematic diagram of an example implementation of a compression system 100 is shown in accordance with one or more exemplary embodiments. The compression system 100 generally includes a press 102, a sensor 110, and a computer 120. The press 102 includes a top chuck 104, a bottom chuck 106, and a load cell 108. The sensor 110 may implement a camera 110a or a dark field camera 110b. The computer 120 includes one or more processors 122 (one shown) and one or more memory devices 124 (one shown).

The press 102 implements a precision die bonder. In various embodiments, the press 102 implements a substrate-to-substrate thermocompression press. The press 102 is operational to align and press two substrates together to form inter-substrate connections. The alignment may be provided by movement of the top chuck 104 relative to the bottom chuck 106 in multiple dimensions. By way of example, the top chuck 104 may tilt 130 relative to the bottom chuck 106. The tilt 130 may include movement in a pitch direction 130*a* and a roll direction 130*b*. In some embodiments, the bottom chuck 106 may be rotatable relative to the top chuck 104 in a yaw direction 132. In other embodiments, the top chuck 104 may be rotatable relative to the bottom chuck 106 in the yaw direction 132. The top chuck 104 is also moveable relative to the bottom chuck 106 in a vertical direction 134.

Movement of the top chuck 104 downward along the vertical direction 134 presses a first substrate 140 being held by the bottom chuck 106 against a second substrate 160 being held by the top chuck 104 with a force 136. The force 136 compresses spikes formed on the second substrate 160 into a test film on the first substrate 140. In some embodiments, the first substrate 140 may be held by the top chuck 104 and the second substrate 160 may be held by the bottom chuck 106. The load cell 108 measures the force 136 being applied between the first substrate 140 and the second substrate 160.

The top chuck 104 and the bottom chuck 106 each implement a vacuum chuck. The top chuck 104 and the bottom chuck 106 are operational to hold the second substrate 160 and the first substrate 140 during the bonding process.

The load cell 108 implements a pressure sensor. The load cell 108 is operational to detect the force 136 applied by the second substrate 160 onto the first substrate 140 during a calibration test of the press 102.

The sensor 110 implements an optical sensor. In various embodiments, the sensor 110 is implemented as a camera 110*a*. In some embodiments, the sensor 110 is implemented as a dark field camera 110*b*. The sensor 110 is operational to generate a two-dimensional image of the test film of the first substrate 140 after the spikes of the second substrate 160 have been pressed into the test film.

The computer 120 is coupled to the sensor 110 and the load cell 108. The computer 120 implements one or more data processing computers. In embodiments with multiple computers 120, the individual computers 120 are coupled together to share data, memory space, and processing resources. The computer 120 may be operational to store the configuration data of the press 102 and execute software used to analyze the information received from the sensor 110 and the load cell 108.

The processor 122 implements one or more processors within the computer 120. The processor 122 is in communication with the memory device 124 to exchange commands and data. The processor 122 is operational to execute the software tools used to analyze the images generated by the sensor 110 and the data generated by the load cell 108.

The memory device 124 implements one or more non-transitory computer readable storage devices (e.g., random access memory, read-only memory, magnetic hard drives, solid-state drives, etc.). The memory device 124 stores software programs (or tools) that are executed by the processor 122.

The compression system 100 implements a technique for measuring the local pressure and pressure distributions (maps) that occur during compression bonding of fine-pitch area arrays (e.g., less than 2.5 microns (um) pitch arrays). Therefore, the pressure distribution maps are high resolution pressure maps. Knowledge of the pressure distribution enables development of high yield compression bonding that is fundamental to high density interfaces used to fabricate two-and-a-half dimensional and three-dimensional integrated microelectronic systems. The multi-dimensional integration provides performance advancements due to an increase in interconnectivity between the first substrate 140 and the second substrate 160. The performance advantages may include lower latency, lower energy per bit, faster switching speeds, and the like. In the absence of a method for reworking the high density inter-substrate interfaces, successful bonding takes place in a single pass. Therefore, after the first substrate 140 and the second substrate 160 have calibrated the press 102, the first substrate 140 may be replaced by a first working part 141, and the second substrate 160 may be replaced by a second working part 161. The first working part 141 is subsequently bonded to the second working part 161 by the press 102.

The compression system 100 provides high-resolution positional (e.g., less than 3 um) measurement of local pressures and pressure distribution maps of large area substrates, including wafers, tiles, and/or die level substrates. Arrays of fine-pitch metal knife-edge-like structures (e.g., spikes) on a top substrate (e.g., the second substrate 160) are used to indent a thin test film (e.g., a metal film, an array of metal pads, or an array of bumps) coated on a bottom substrate (e.g., the first substrate 140). In various embodiments, the technique provides large area, fine-pitch nano-indenter arrays. Since a hardness and various material properties of the test film are known, locally applied pressures may be determined from an area and/or a depth of the indentations in the test film. The indenters may be fabricated as conically symmetric tips in a photolithographic process that enables large area spike arrays to be formed on silicon or other substrates with low variation in tip heights. The indenter material is chosen to be harder than the imprinted thin film/pad/bumps to simplify the pressure measurement. In an analysis of the pressure distributions, since the total applied force is known (e.g., determined by a load cell 108 in the stack), the local pressures and the global pressure distributions may be quantitatively determined by the computer 120. Furthermore, the indentation depths and areas may be measured using optical microscopy and a camera 110*a*. In particular, a dark field camera 110*b* operates with off-axis light to generate images in dark field operations. The images capture the intensity of the scattered light from the individual imprints. The light intensity has a linear relation with the dimensions (e.g., area and depth) of the imprints. Conically shaped spike indenters generally provide radially symmetric indentation divots that acts as retroreflectors. Other shapes of the indenters may be implemented to meet a design criteria of a particular application.

In nano-indentation metrology applications, a maximum load Pmax may be obtained from knowing a hardness H of the indented material and the residual indentation area Ar from the expression Pmax=H×Ar. In the case of compression bonded arrays, the candidate metal contact layout may be replicated in a spike array fabrication process with the spike structures substituted for the bond pads. The replicated fine-pitch spike array is subsequently used to imprint a blanket-coated metal substrate (typically a silicon wafer with a thin (e.g., 0.5 um) gold film. The imprinted divot pattern is used to measure the pressure distribution of an original bump layout pattern. The pressure measurement may also be used to measure tool and/or bonder related effects such as tilts, tool bending, and clamping issues.

Figure 2:
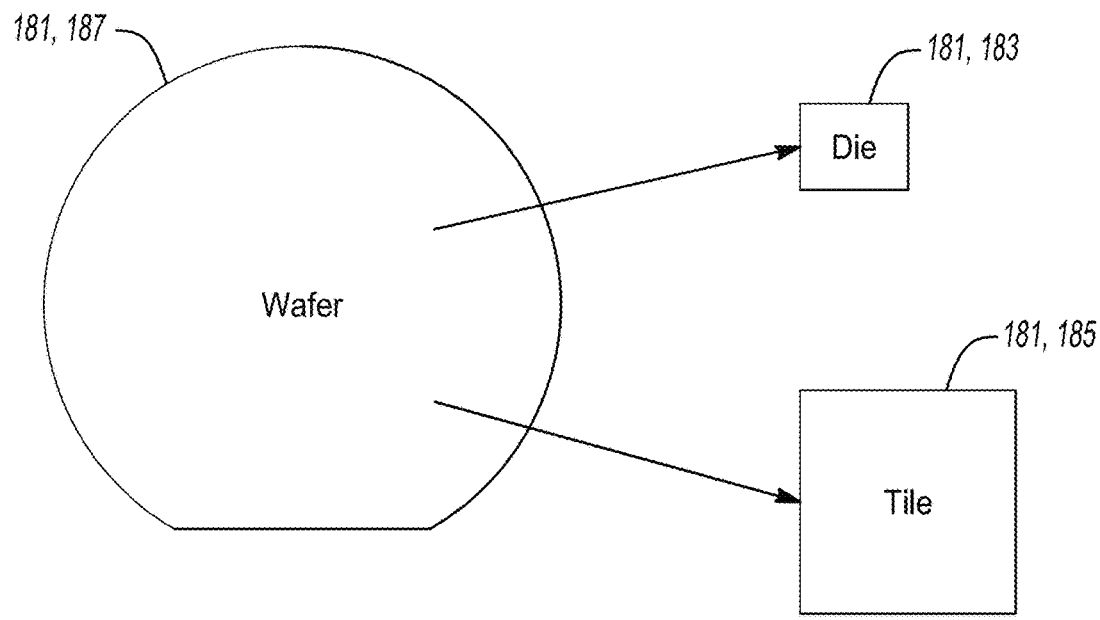
FIG. 2 is a schematic plan diagram of various substrates in accordance with one or more exemplary embodiments.

Referring to FIG. 2, a schematic plan diagram of example implementations of various substrates are shown in accordance with one or more exemplary embodiments. The substrate may be formed of a semiconductor 181. The semiconductor 181 generally includes silicon, germanium, gallium arsenide, aluminum gallium arsenide, silicon carbide, gallium nitride, indium phosphide and the like. The substrates may be in the form of a semiconductor die 183, a semiconductor tile 185, or a semiconductor wafer 187.

Figure 3:
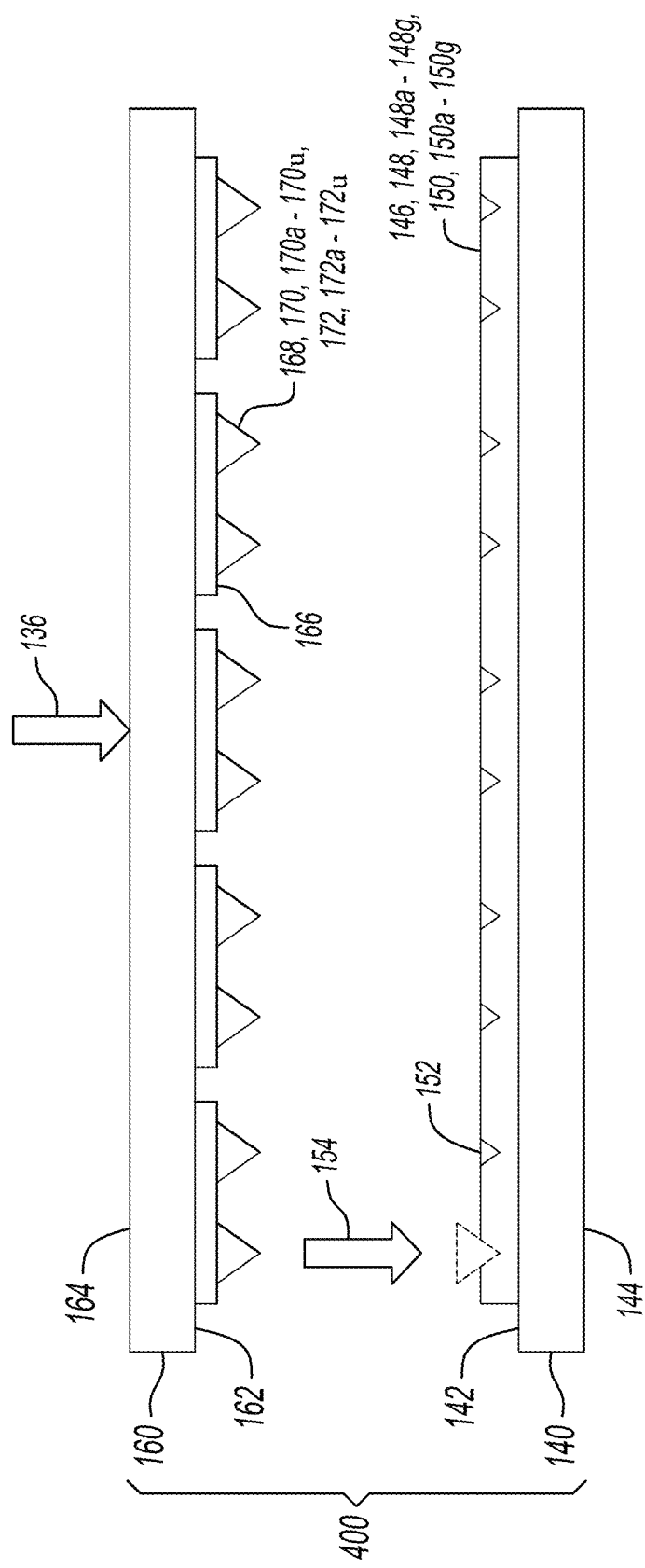
FIG. 3 is a schematic side diagram of a calibration kit in accordance with one or more exemplary embodiments.

Referring to FIG. 3, a schematic side diagram of an example arrangement of a calibration kit 400 is shown in accordance with one or more exemplary embodiments. The calibration kit 400 generally includes the first substrate 140 and the second substrate 160. The first substrate 140 is generally positioned below the second substrate 160 in the press 102 (FIG. 1). The first substrate 140 has a first surface 142 facing a second surface 162 of the second substrate 160. The first substrate 140 includes a third surface 144 opposite the first surface 142. Likewise, the second substrate 160 includes a fourth surface 164 opposite the second surface 162.

A test film 146 is fabricated on the first surface 142 of the first substrate 140. In various embodiments, the test film 146 may be a uniform sheet of material (e.g., metal), an array of pads, or an array of bonding bumps. The test film 146 may be fabricated as one or more layers of a variety of test film materials 148 each having a test film hardness 150 (e.g., Young's Modulus). The test film materials 148a-148g/test film harnesses 150a-150g in gigapascals (GPa) may include, but are not limited to, gold/78 GPa, aluminum/70 GPa, indium/11 GPa, copper/130 GPa, platinum/168 GPa, palladium/121 GPa, and alloys thereof with a hardness less than approximately 116 GPa.

An array of pads 166 is fabricated on the second surface 162 of the second substrate 160. In various embodiments, the pads 166 may be a uniform array of pads 166 and/or a random array of pads 166. One or more spikes 168 is fabricated on each pad 166. The spikes 168 are fabricated as one or more layers of a spike material 170 each having a spike material hardness 172. The spike materials 170a-170u/spike material hardness 172a-172u may include, but are not limited to, beryllium/287 GPa, titanium/116 GPa, palladium/121 GPa, vanadium/128 GPa, copper/130 GPa, manganese/198 GPa, nickel/200 GPa, cobalt/209 GPa, iron/211 GPa, rhodium/275 GPa, chromium/279 GPa, molybdenum/329 GPa, ruthenium/447 GPa, platinum/168 GPa, tantalum GPa/186 GPa, tungsten/411 GPa, rhenium/463 GPa, iridium/528 GPa, aluminum oxide/300 GPa, silicon carbide/137 GPa, and an alloy thereof having a hardness of at least approximately 116 GPa. The spike material hardness 172 is selected to be larger than the test film hardness 150 to avoid the tips of the spikes 168 being plastically deformed during the indentation.

The force 136 that presses the second substrate 160 against the first substrate 140 applies a local pressure 154 between each spike 168 and the test film 146. The local pressure 154 of a spike 168 creates an indentation 152 in the test film 146, one indentation 152 per spike 168.

Figure 4:
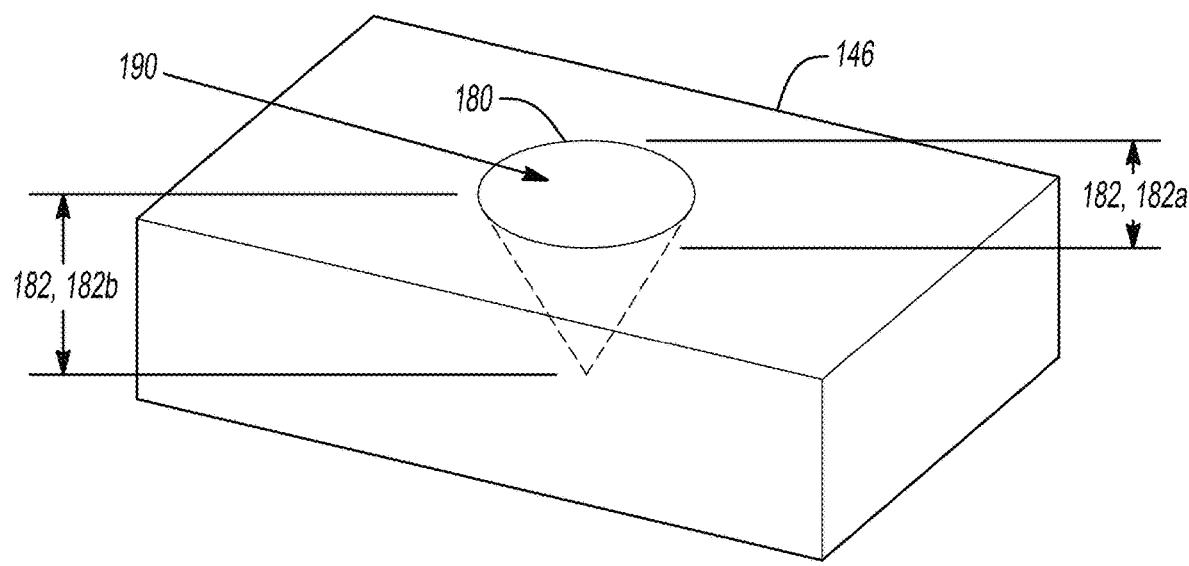
FIG. 4 is a schematic perspective diagram of a test film in accordance with one or more exemplary embodiments.

Referring to FIG. 4, a schematic perspective diagram of an example indentation in the test film 146 is shown in accordance with one or more exemplary embodiments. The indentation generally has a shape 180 of a spike 168. In various embodiments, the shape 180 of the spike 168 may be conical. Other shapes 180 of other spikes 168 may be implemented to meet the design criteria of a particular application.

The shape 180 includes multiple dimensions 182. The dimensions 182 may include at least a diameter 182a and a depth 182b. An off-axis light 190 is illustrated to show how the test film 146 is illuminated while measuring an amount of scattered light caused by the indentation.

Figure 5:
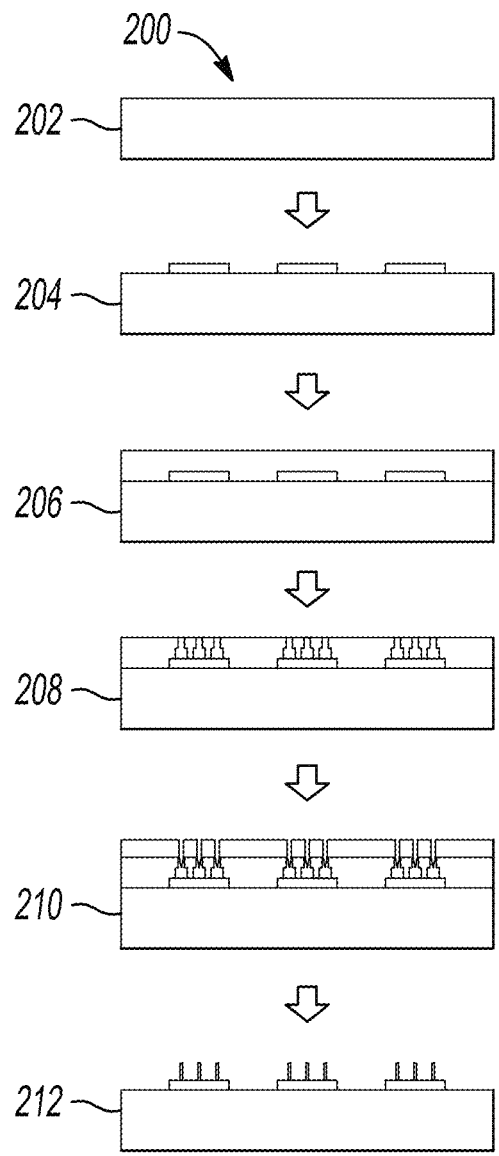
FIG. 5 is a schematic diagram of a method for fabrication of spikes in accordance with one or more exemplary embodiments.

Referring to FIG. 5, a schematic diagram of an example method 200 for fabrication of the spikes 168 is shown in accordance with one or more exemplary embodiments. The method 200 includes steps 202 to 212, as illustrated. The sequence of steps is shown as a representative example. Other step orders may be implemented to meet the criteria of a particular application. The method (or process) 200 may be performed using standard semiconductor fabrication techniques. A shape and dimensions of the spikes 168 are controlled by a lithographic patterning used to define a base diameter of the spikes 168. Deposited metal is used to fabricate the spikes 168.

In the step 202, the second surface 162 of the second substrate 160 may be cleaned and prepared for a metal deposition. A metal for the pads 166 is deposited and patterned in the step 204. A mask is deposited on the pads 166 in the step 206. The mask may be a reverse image or bilayer resist process so that when images, re-entrant sidewalls result. In various embodiments, the deposition and patterning for the pads 166 may be skipped and the mask deposited directly on the second substrate 160. Gaps are imaged into the mask in the step 208.

In the step 210, the spike material 170 is deposited onto the mask and into the gaps to form the spikes 168. The spike material 170 may be deposited by evaporation. The deposition results in the formation of knife-edge microstructures in the gaps. An over-coat material may optionally be formed over the spikes 168 using a photoresist coating, a photoresist patterning, and an evaporation of the over-coat material. The spike material 170 remaining on the mask and the mask itself are removed in the step 212 to leave the spikes 168 exposed and protruding away from the second surface 162 of the second substrate 160.

Figure 6:
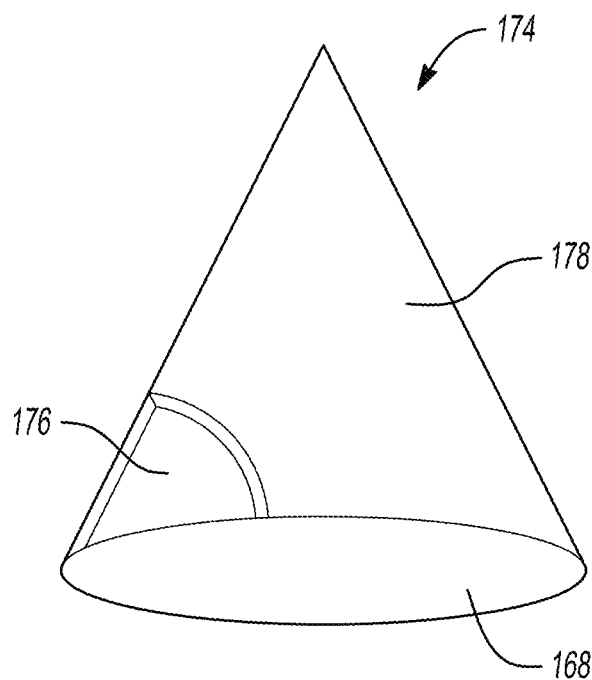
FIG. 6 is a schematic perspective diagram of a structure of a spike in accordance with one or more exemplary embodiments.

Referring to FIG. 6, a schematic perspective diagram of an example structure of a spike 168 is shown in accordance with one or more exemplary embodiments. The spike 168 generally has a cone shape 174. The spike 168 comprises an inner layer 176 optionally covered by an over-coat layer 178. The inner layer 176 may be selected from among the spike materials 170. The over-coat layer 178 may be selected from among the spike materials 170 and/or oxides of the spike materials 170. In various embodiments, the over-coat layer 178 is included to prevent a metallurgical bond from forming between the spike 168 and the test film 146 due to the compression.

A taper angle of the spikes 168 is controlled by the metal used in the fabrication. Examples of taper angles include gold (78°), titanium (68°), and platinum (78°). Other metals may be used to achieve other taper angles. The spikes 168 may be constructed with narrow tip radii of approximately 5 nanometers (nm) and larger, and a fine pitch of 0.3 um and larger (e.g., >0.8). Other tip radii and/or pitch may be implemented to meet the design criteria of a particular application.

Figure 7:
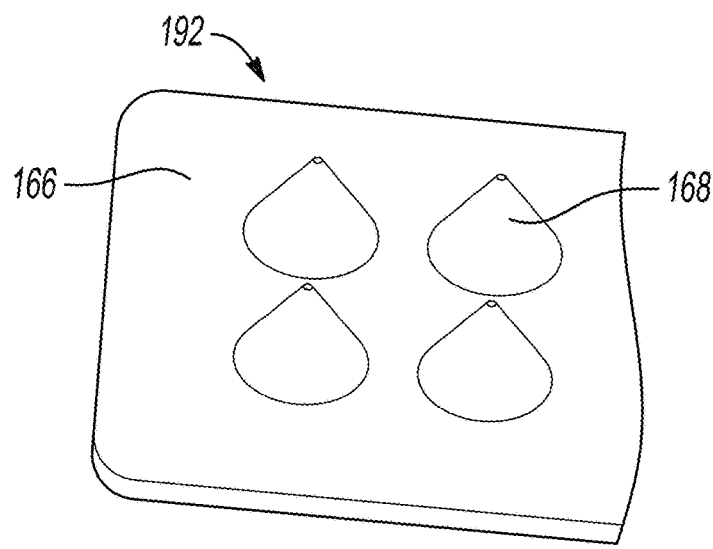
FIG. 7 is an image of a set of spikes in accordance with one or more exemplary embodiments.

Referring to FIG. 7, an image 192 of an example set of spikes 168 is shown in accordance with one or more exemplary embodiments. In the example, four spikes 168 are created on a pad 166. The image 192 illustrates a scanning electron micrograph of titanium spikes 168 used to form patterned arrays of indenter tips. Using a single evaporator source titanium, the spikes 168 exhibit a 68° taper angle. The four spikes 168 have a separation of approximately 2.75 um tip-to-tip. Reducing base diameter of the spike 168 results in lower tips that may be packed closer together and decrease the pitch. Titanium spike structures have been observed to be compressed against test films 146 multiple times without deformation. The conical shaped tips of the spikes 168 create simple divot indentations that simplify the analysis and correlation of the imprint area with the scattered illumination in dark field microscopy.

Figure 8:
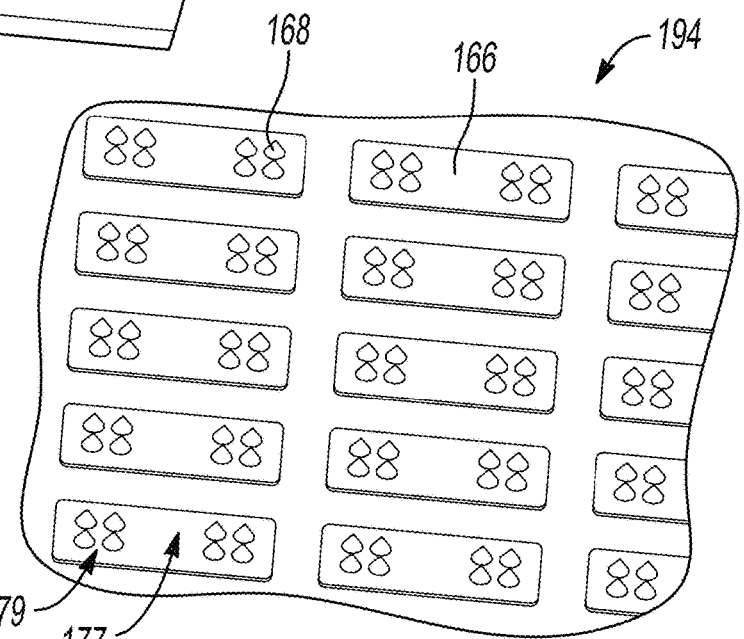
FIG. 8 is an image of an array of spikes in accordance with one or more exemplary embodiments.

Referring to FIG. 8, an image 194 of an example array of spikes 168 is shown in accordance with one or more exemplary embodiments. The image 194 illustrates another scanning electron micrograph of the titanium spikes 168 and pads 166. The pads 166 are arranged in a pad pattern 177. On each pad 166, the spikes 168 are arranged in a spike pattern 179. The spike pattern 179 illustrated has a group of four spikes 168 on one side of a pad 166 and another group of four spikes 168 on an opposing side of the pad 166. The quad groups of spikes 168 are illustrated on a 10 micron pitch. Other pitches may be implemented to meet the design criteria of a particular application.

Figure 9:
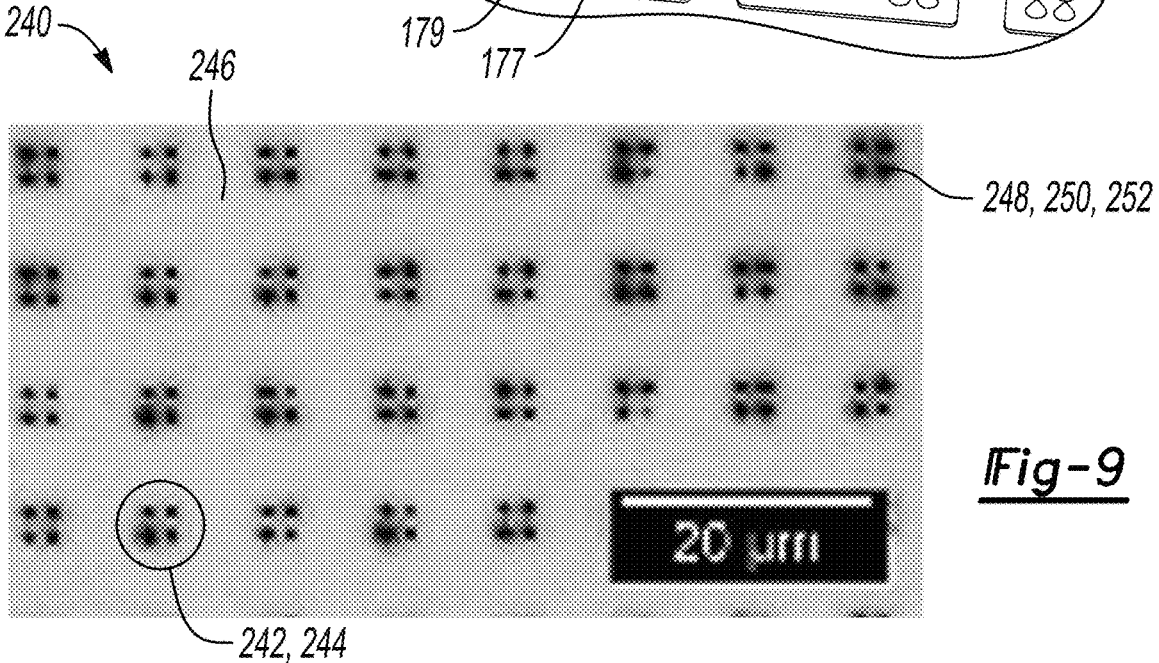
FIG. 9 is an image of a local indentation pattern in accordance with one or more exemplary embodiments.

Referring to FIG. 9, an image 240 of an example local indentation pattern is shown in accordance with one or more exemplary embodiments. The image 240 illustrates a 4 millimeter×4 millimeter (mm) indentation pattern using a spike array with a 10 um pitch. Brightness of the image 240 is reversed for the sake of presentation and reproduction. Dark areas of the image 240 are actually bright, and light areas are actually dark. Therefore, area 246 would be seen as a dark background area, and groups of spikes 242 would be seen as bright areas that form indentation patterns of bright lights 244.

The image 240 is a dark field micrograph showing the light intensity 250 of individual bright indentations 248 (e.g., individual indented divots) seen at high magnification that collectively form the entire array. In the example, the spike array is fabricated on a 600 um thick silicon substrate and the spikes 168 are made with titanium (68° taper angle). The spike pattern forms groups of 4 spikes 168 with 2.75 um tip-to-tip separation, on a 10 um pitch. The intensity distribution is proportional to the changes in the local pressure that is dependent on pattern uniformity and discontinuities at the boundaries (edges and corners). The light intensity 250 from the imprints is related to the area and the depth of the imprints as the scattered light in the dark field image 240 is proportional to the exposed sidewalls of the conical imprint. The light intensity 250 is directly proportional to the absolute values 252 of the local pressures 154 (FIG. 3)

Figure 10:
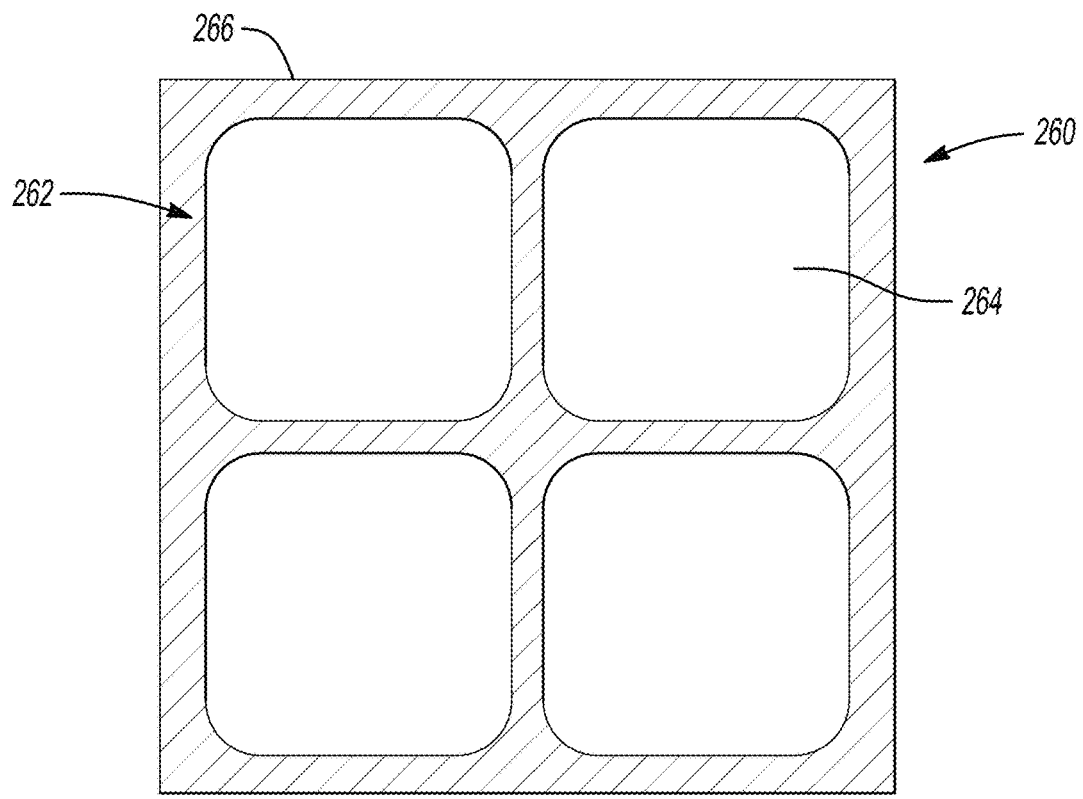
FIG. 10 is an image of a wide indentation pattern in accordance with one or more exemplary embodiments.

Referring to FIG. 10, an image 260 of an example wide indentation pattern is shown in accordance with one or more exemplary embodiments. The 4 mm×4 mm array of spikes 168 in the image 260 includes 640,000 individual imprints with array patterns identical to the pattern shown in the image 240 (FIG. 9). While the spike array in the example was uniform, the effects of tooling are evident where the under-compressed edges and corners (due to footprint of the tool being undersized relative to the spike array) and the center (due to the vacuum hold pattern) show up as darker areas 262, and the properly-compressed areas show up as bright areas 264.

The dark field microscopy optical technique was used to generate the image 240 (FIG. 9) and the image 260 to determine the area of the indentation pattern. In the dark field microscopy, an aperture is located behind a collecting lens. The aperture takes out the normal reflected light and only allows off-angled light to enter and be recorded. Therefore, the spike patterns are more intense than the relatively flat test film 146.

The light intensities in the image 260 represent a high-resolution pressure map 266. The computer 120 (FIG. 1) may sum the individual light intensities. The total light intensity is proportional to the force that has been applied. Knowing the force 136 as measured by the load cell 108 (FIG. 1) and the total number of spikes 168, the computer 120 may calculate the local pressure 154 (FIG. 3) that each spike 168 applied to the test film 146. Thereafter, the computer 120 may convert the light intensity distribution into the pressure map 266 on the first surface 142 of the first substrate 140.

Figure 11:
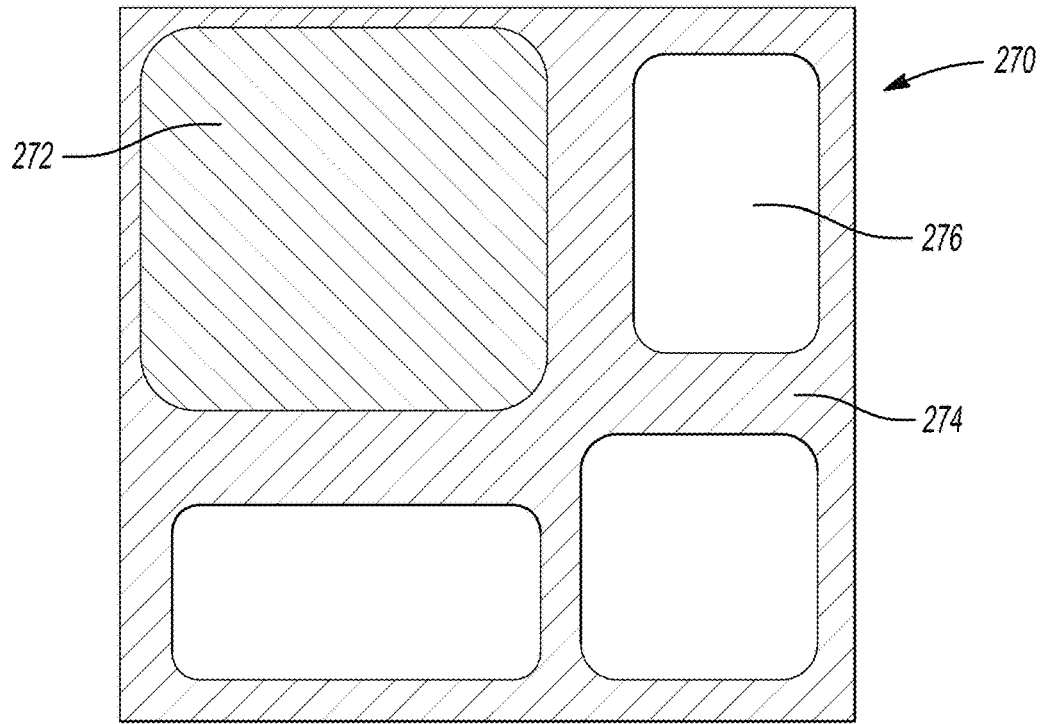
FIG. 11 is an image of a non-uniform indentation pattern in accordance with one or more exemplary embodiments.

Referring to FIG. 11, an image 270 of an example non-uniform indentation pattern is shown in accordance with one or more exemplary embodiments. In the example, the top chuck 104 of the press 102 (e.g., an FC300 precision bonder) was intentionally tilted relative to the bottom chuck 106 to demonstrate the effect. Other tooling and array pattern effects may be assessed using a similar method (e.g., tooling sizes, vacuum hold downs for sample clamping, array pattern non-uniformities, etc.). With indentation divot depths on the order of 200 nm, silicon-based spike arrays may accommodate approximately 50 microradian (approximately 3 millidegree) of tilt over a 4 mm distance.

The image 270 is a dark-field optical micrograph showing a non-uniform pressure distribution resulting from the tilted condition between the spikes 168 and the flat test film 146. Tilts may arise from improper tooling calibration, load path non-uniformities, defects on the backside of the samples, and/or layout design errors. High pressures region 272 in a corner, and along a lower edge, are the result of the pattern discontinuities at the perimeter of the uniform array. Intermediate pressure regions 274 generally exist along the edges and beneath the vacuum hold. Proper pressure regions 276 were formed in a few areas.

For thermal compression bonding, a minimum amount of pressure is specified to create the bonds between bonding bumps on one substrate and corresponding bonding pads on another substrate. To achieve a high bond yield, a majority of the bonds may be in the proper pressure regions 276 and some bonds may be acceptable in the intermediate pressure regions 274. No bonds are formed in null pressure areas or low pressure areas. In the high pressure regions 272, the bump bonds are likely to expand outward and short to one another. Therefore, the image 260 (FIG. 10) and the image 270 enable quick assessment of pressure distributions of the array patterns.

Figure 12:
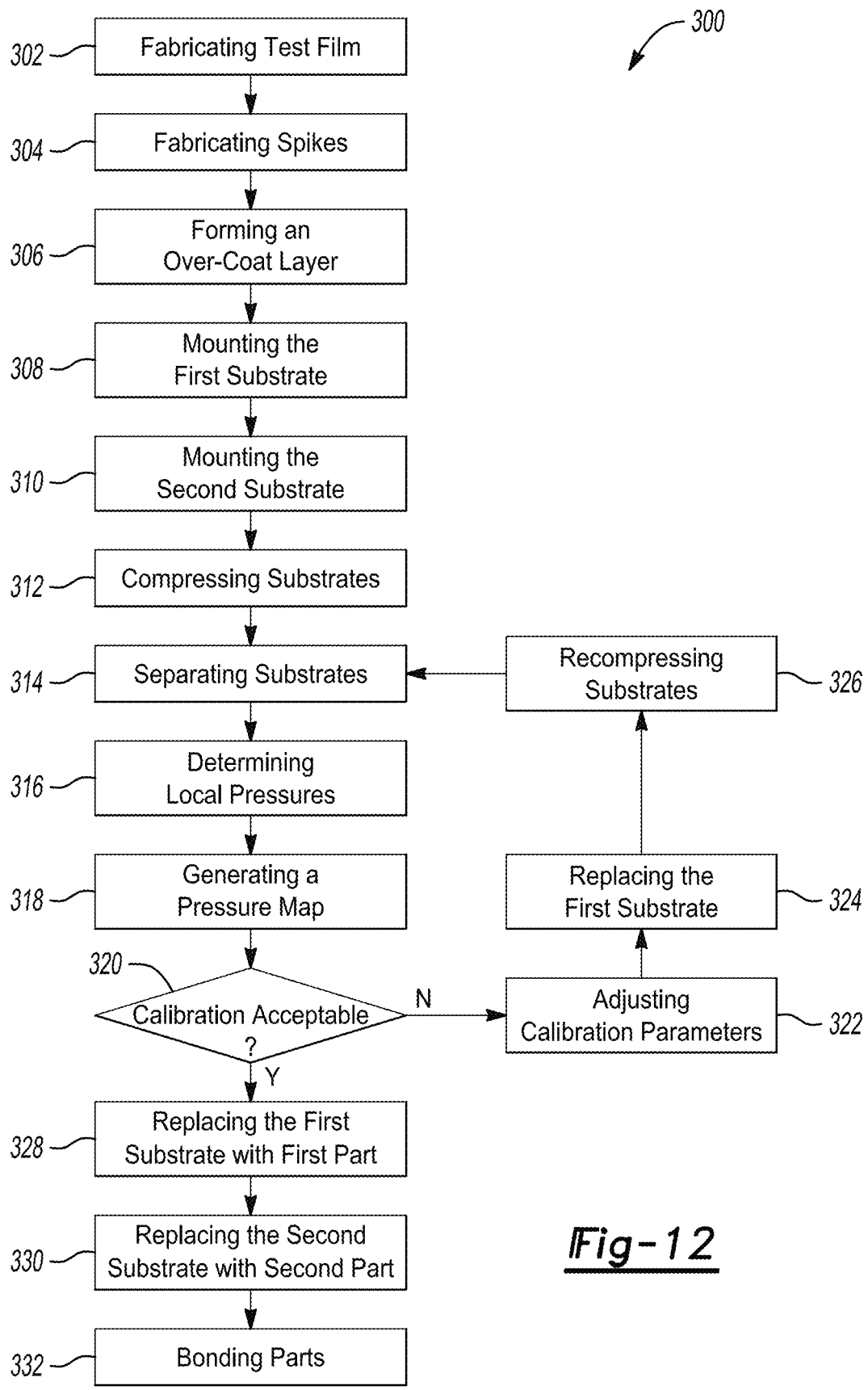
FIG. 12 is a flow diagram of a method to aid in a calibration of the compression system in accordance with one or more exemplary embodiments.

Referring to FIG. 12, a flow diagram of an example method 300 to aid in a calibration of the compression system 100 is shown in accordance with one or more exemplary embodiments. The method 300 includes steps 302 to 332, as illustrated. The sequence of steps is shown as a representative example. Other step orders may be implemented to meet the criteria of a particular application. The method (or process) 300 is implemented with the compression system 100 with an unused first substrate 140 and a second substrate 160.

In the step 302, the test film 146 may be fabricated on the first substrate 140. The spikes 168 may be fabricated on the second substrate 160 in the step 304. The optional over-coat layer 178 may be formed on each spike 168 in the step 306. The over-coat layer 178 generally prevents a formation of a metallurgical bond between the spikes 168 and the test film 146 during the compressing.

In the step 308, the first substrate 140 may be mounted to the bottom chuck 106 in the press 102 with a first surface 142 facing outward. In the step 310, the second substrate 160 may be mounted to the top chuck 104 in the press 102 with a second surface 162 of the second substrate 160 facing the first surface 142 of the first substrate 140. In such a configuration, the spikes 168 are facing the test film 146. The first substrate 140 and the second substrate 160 are compressed together in the step 312 with a sufficient force 136 to causes the spikes 168 to form the indentations 152 in the test film 146. After the indentations 152 are created, the first substrate 140 is separated from the second substrate 160 in the step 314.

In the step 316, the computer 120 may determine local pressures 154 applied by the spikes 168 against the test film 146 during the compression based on the images received from the sensor 110. The computer 120 may generate a pressure map 266 in two-dimensions based on the calculated local pressures 154 in the step 318.

A check of the acceptability of the calibration acceptable is performed at the step 320. If the calibration parameters did not produce an acceptable pressure map 266, one or more calibration parameters (e.g., the tilt 130 and/or the force 136) of the press 102 may be adjusted in the step 322. Thereafter, the first substrate 140 may be replaced in the step 324 with an additional first substrate 140 with a new test film 146. With the additional first substrate 140 in place, the spikes 168 are compressed into the new test film 146 in the step 326.

If the calibration is acceptable in the step 320, the first substrate 140 may be replaced in the step 328 with the first working part 141. The second substrate 160 may be replaced in the step 330 with the second working part 161. In the step 332, the first working part 141 and the second working part 161 may be bonded together by the force 136 applied by the press 102.

Figure 13:
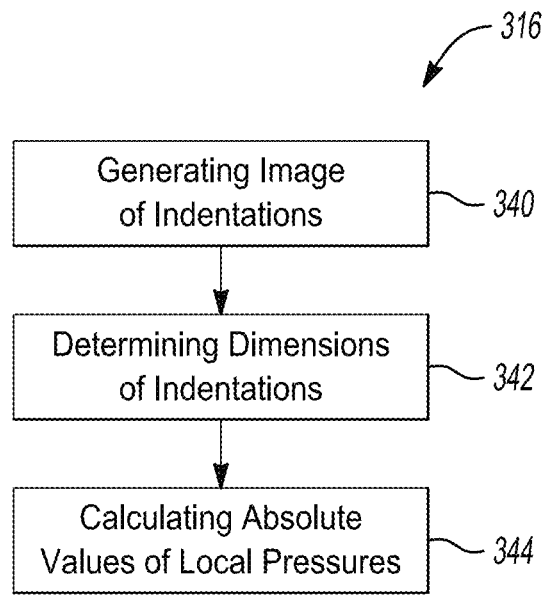
FIG. 13 is a flow diagram of a method to determine local pressures in accordance with one or more exemplary embodiments.

Referring to FIG. 13, a flow diagram of an example method for step 316 to determine the local pressures is shown in accordance with one or more exemplary embodiments. The method generally includes steps 340 to 344, as illustrated. The sequence of steps is shown as a representative example. Other step orders may be implemented to meet the criteria of a particular application.

In the step 340, the sensor 110 generates an image of the indentations 152 in the test film 146. The light intensities 250 in the image (e.g., image 240 in FIG. 9) are representative of the local pressures 154 applied by the spikes 168 against the test film 146 during the compression. The computer 120 determines the dimensions 182 of the indentations 152 in response to the light intensities 250 in the image in the step 342. In the step 344, the computer 120 calculates absolute values 252 of the local pressures 154 applied to the test film 146 in response to the dimensions 182 of the indentations 152 and the force 136 applied between the first substrate 140 and the second substrate 160.

Figure 14:
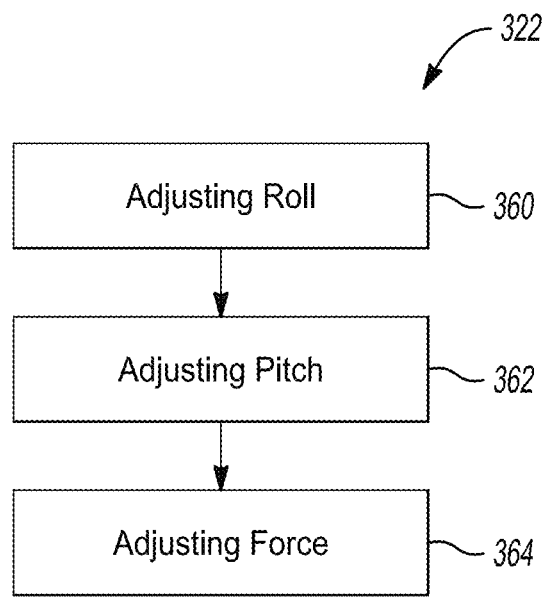
FIG. 14 is a flow diagram of a method to adjust calibration parameters in accordance with one or more exemplary embodiments.

Referring to FIG. 14, a flow diagram of an example method for step 322 to adjust the calibration parameters is shown in accordance with one or more exemplary embodiments. The method generally includes steps 360 to 364, as illustrated. The sequence of steps is shown as a representative example. Other step orders may be implemented to meet the criteria of a particular application.

In the step 360, the press 102 is adjusted in the roll direction 130b to help planarize the first substrate 140 with the second substrate 160. The press 102 is adjusted in the pitch direction 130a in the step 362 to help further planarize the first substrate 140 with the second substrate 160. In the step 364, the force 136 that the press 102 applies between the first substrate 140 and the second substrate 160 may be adjusted. Other calibration parameters of the press 102, the top chuck 104, the bottom chuck 106, the load cell 108, the first substrate 140 and/or the second substrate 160 may be changed in response to the pressure map 266.

Embodiments of the disclosure provide a fine-pitch arraying capability by employing metal indenters (e.g., the spikes 168) with sufficient high hardness to indent many common thermocompression bond metals. The use of titanium as the indenters has benefits since titanium readily forms a surface oxide that acts as a natural release layer preventing metallurgical bonds to form between the titanium indenter tip and the indented metal materials (configured as the thin film or patterned as bumps). The hardness of the titanium indenters allow the plastically deformed indentations to remain unperturbed after the indenters are withdrawn.

The fabrication of the spike arrays is useful in the pressure measurements and mapping, and generally outperforms standard methods. The fabrication process provides advantages of fine-pitch arrays (e.g., less than 10 um). The fabrication process enables arrays with low tip height variation (e.g., down to <10 nm) because the spike heights are made with a self-limiting process that enables high fidelity replication. The sharp tips (e.g., approximately 10 nm dimensions) are integral to the fabrication process as the photoresist opening is closed as the titanium is deposited. The fabrication process provides an ability to fabricate a variety of different metals with high hardness (e.g., >116 GPa). The fabrication process also provides an ability to engineer the hardness by layering the spike structure (e.g., titanium and tungsten layered with softer metals such as gold, platinum, and palladium) and/or apply an over-coat to the spikes to improve its release after indentation and prevent metallurgical bonds to form (e.g., natural oxides help to prevent metallurgical bonds to indented material layers or bumps).

The compression system 100 provides a method and device includes fine-pitch arrays of high hardness, conically shaped needle-like microstructures (spikes) and a flat thin metal film or a pattern flat metal film such that when the indenter array (fine-pitch spikes) is pressed onto the metal film, the local pressures and pressure distributions maps may be derived from the imprinted divot dimensions. The compression system 100 provides an optical method for converting the reflected light spatial intensity variation from conically shaped divots with nanometer dimensions into quantitative pressures and pressure distribution maps using a known applied force. The pressure distribution maps provide data useful for predicting bond yields from derived pressure thresholds from fine-pitch bond pad layout patterns using spike pressures and pressure mapping methods configured to mimic the layout pattern.

Use of the first substrate 140 and the second substrate 160 to calibrate the press 102 results in an ability to prescreen candidate array layouts to access bond uniformity and yields. Since thermocompression bonds are not repairable, making a first-pass compression successful is helpful for manufacturing viability. The test kit 400 has a potential to ensure implementation of high yield designs, and allows testing of array pattern variations and tooling without the overhead of the entire process costs. Calibration of the compression system 100 has application to other semiconductor technologies where three-dimensional integration is a performance driver (e.g., radio-frequency systems, and microelectromechanical systems).

In various embodiments, the compression system 100 is useful for measuring local pressures and global pressures from the nanometer to decimeter scale for wafer-to-wafer, die-to-wafer, and die-to-die thermocompression bonding applications. Numerous factors affect the pressures and pressure distributions observed during thermocompression bonding including bonder tooling, array patterns and pitches, substrate mechanical properties, and applied forces. The compression system 100 operates at high resolution to provide quantitatively accurate pressure measurements and pressure distributions across seven orders of magnitude length scales and employs materials, tooling, and layouts that closely mimic those used in semiconductor manufacturing.

Embodiments of the disclosure provide measurements of pressure distributions for arbitrarily configured area arrays during bonding, where the arrays are scalable from small area arrays (e.g., 1,000 bump elements) to large area arrays (e.g., >1,000,000 bump elements). The disclosure provides light intensity to pressure conversion for efficient pressure mapping and analysis. Calibration parameters for press tilt, other bonder tooling issues (e.g., warp and tool sizing), and/or substrate parameters (e.g., thickness) that contribute to the array pressure non-uniformities may be identified before working parts are combined. The disclosure provides quick development of bond recipes by determining applied force suitable for achieving threshold local pressures for high yield bonding.

This disclosure is susceptible of embodiments in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Background, Summary, and Detailed Description sections, but not explicitly set forth in the claims, should not be incorporated into the claims, singly or collectively, by implication, inference or otherwise.

For purposes of the present detailed description, unless specifically disclaimed, the singular includes the plural and vice versa. The words "and" and "or" shall be both conjunctive and disjunctive. The words "any" and "all" shall both mean "any and all", and the words "including," "containing," "comprising," "having," and the like shall each mean "including without limitation." Moreover, words of approximation such as "about," "almost," "substantially," "approximately," and "generally," may be used herein in the sense of "at, near, or nearly at," or "within 0-5% of," or "within acceptable manufacturing tolerances," or other logical combinations thereof. Referring to the drawings, wherein like reference numbers refer to like components.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment may be combined with one or a plurality of other desired characteristics from other embodiments, resulting in other embodiments not described in words or by reference to the drawings. Accordingly, such other embodiments fall within the framework of the scope of the appended claims.

What is claimed is:

1. A method to aid in a calibration of a compression system comprising:
    mounting a first substrate with a first surface facing outward in a press, wherein the press has a plurality of calibration parameters, and the first substrate has a test film on the first surface;
    mounting a second substrate in the press with a second surface of the second substrate facing the first surface of the first substrate, wherein the second substrate has a plurality of spikes arranged in a spike pattern on the second surface;
    compressing the first substrate and the second substrate together with a force that causes the plurality of spikes to form a plurality of indentations in the test film;
    separating the first substrate from the second substrate;
    determining, with a sensor, a plurality of local pressures applied by the plurality of spikes against the test film during the compressing and generating an image of the plurality of indentations in the test film, wherein a plurality of light intensities in the image are representative of the plurality of local pressures applied by the plurality of spikes against the test film during the compressing; and
    adjusting one or more of the plurality of calibration parameters of the press in response to the plurality of local pressures.

2. The method according to claim 1, further comprising: determining a plurality of dimensions of the plurality of indentations in response to the plurality of light intensities in the image; and
    calculating a plurality of absolute values of the plurality of local pressures applied to the test film in response to the plurality of dimensions of the plurality of indentations and the force applied between the first substrate and the second substrate.

3. The method according to claim 1, further comprising: forming an over-coat layer on each of the plurality of spikes that prevents a formation of a metallurgical bond between the plurality of spikes and the test film during the compressing.

4. The method according to claim 1, wherein the adjusting of the one or more of the plurality of calibration parameters of the press is adjusting a tilt that the press establishes between the first substrate and the second substrate.

5. The method according to claim 1, wherein the adjusting of the one or more of the plurality of calibration parameters of the press is adjusting the force that the press applies during the compressing.

6. The method according to claim 1, further comprising: generating a pressure map in two-dimensions based on the plurality of local pressures, wherein the adjusting of the one or more of the plurality of calibration parameters of the press is in further response to the pressure map.

7. The method according to claim 1, further comprising: replacing the first substrate with an additional first substrate after the adjusting of the one or more of the plurality of calibration parameters of the press; and
    compressing the additional first substrate and the second substrate together with the force.

8. The method according to claim 1, further comprising: replacing the first substrate with a first working part after the adjusting of the one or more of the plurality of calibration parameters;
    replacing the second substrate with a second working part; and
    bonding the first working part to the second working part with the press.

9. A system to aid in a calibration of a compression system comprising:
    a first substrate having a test film on a first surface;
    a second substrate having a plurality of spikes arranged in a spike pattern on a second surface;

a press having a plurality of calibration parameters, the press is configured to:
  mount the first substrate with the first surface facing outward;
  mount the second substrate with the second surface of the second substrate facing the first surface of the first substrate;
  compress the first substrate and the second substrate together with a force that causes the plurality of spikes to form a plurality of indentations in the test film; and
  separate the first substrate from the second substrate; and
a sensor configured to determine a plurality of local pressures applied by the plurality of spikes against the test film during the compression, wherein one or more of the plurality of calibration parameters of the press is configured to adjust in response to the plurality of local pressures and wherein each of the plurality of spikes is formed with an over-coat layer that prevents a formation of a metallurgical bond between the plurality of spikes and the test film during the compression.

10. The system according to claim 9, wherein:
the plurality of spikes have a cone shape; and
the spike pattern comprises at least 1,000 of the plurality of spikes.

11. The system according to claim 9, wherein:
the test film is formed from gold, aluminum, indium, copper, platinum, palladium, or a first alloy thereof; and
the plurality of spikes is formed from beryllium, titanium, palladium, vanadium, copper, manganese, nickel, cobalt, iron, rhodium, chromium, molybdenum, ruthenium, platinum, tantalum, tungsten, rhenium, iridium, aluminum oxide, silicon carbide, or a second alloy thereof.

12. The system according to claim 9, wherein each of the first substrate and the second substrate comprises a semiconductor.

13. The system according to claim 12, wherein: the first substrate is one of a semiconductor die, a semiconductor tile, or a semiconductor wafer; and the second substrate is one of a semiconductor die, a semiconductor tile, or a semiconductor wafer.

14. The system according to claim 9, wherein the sensor is a camera configured to generate an image of the plurality of indentations in the test film, wherein a plurality of light intensities in the image are representative of the plurality of local pressures applied by the plurality of spikes against the test film during the compression.

15. The system according to claim 14, further comprising a computer configured to:
  determine a plurality of dimensions of the plurality of indentations in response to the plurality of light intensities in the image; and
  calculate a plurality of absolute values of the plurality of local pressures applied to the test film in response to the plurality of dimensions of the plurality of indentations and the force applied between the first substrate and the second substrate.

16. The system according to claim 14, wherein:
each of the plurality of indentations has a shape that retroreflects light; and the camera presents the image as off-axis light reflecting from the plurality of indentations.

17. A method to aid in a calibration of a compression system comprising:
  mounting a first substrate with a first surface facing outward in a press, wherein the press has a plurality of calibration parameters, and the first substrate has a test film on the first surface;
  mounting a second substrate in the press with a second surface of the second substrate facing the first surface of the first substrate, wherein the second substrate has a plurality of spikes arranged in a spike pattern on the second surface;
  compressing the first substrate and the second substrate together with a force that causes the plurality of spikes to form a plurality of indentations in the test film;
  separating the first substrate from the second substrate;
  determining, with a sensor, a plurality of local pressures applied by the plurality of spikes against the test film during the compressing;
  adjusting one or more of the plurality of calibration parameters of the press in response to the plurality of local pressures; and
  generating a pressure map in two-dimensions based on the plurality of local pressures, wherein the adjusting of the one or more of the plurality of calibration parameters of the press is in further response to the pressure map.

18. A method to aid in a calibration of a compression system comprising:
  mounting a first substrate with a first surface facing outward in a press, wherein the press has a plurality of calibration parameters, and the first substrate has a test film on the first surface;
  mounting a second substrate in the press with a second surface of the second substrate facing the first surface of the first substrate, wherein the second substrate has a plurality of spikes arranged in a spike pattern on the second surface;
  compressing the first substrate and the second substrate together with a force that causes the plurality of spikes to form a plurality of indentations in the test film;
  separating the first substrate from the second substrate;
  determining, with a sensor, a plurality of local pressures applied by the plurality of spikes against the test film during the compressing;
  adjusting one or more of the plurality of calibration parameters of the press in response to the plurality of local pressures;
  replacing the first substrate with a first working part after the adjusting of the one or more of the plurality of calibration parameters;
  replacing the second substrate with a second working part; and
  bonding the first working part to the second working part with the press.

19. The method according to claim 18, wherein the adjusting of the one or more of the plurality of calibration parameters of the press is adjusting a tilt that the press establishes between the first substrate and the second substrate.

20. The method according to claim 18, wherein the adjusting of the one or more of the plurality of calibration parameters of the press is adjusting the force that the press applies during the compressing.

* * * * *